May 12, 1970 J. AVINS 3,512,098
TRANSISTOR ELECTRICAL CIRCUIT WITH COLLECTOR VOLTAGE STABILIZATION
Filed Aug. 28, 1967
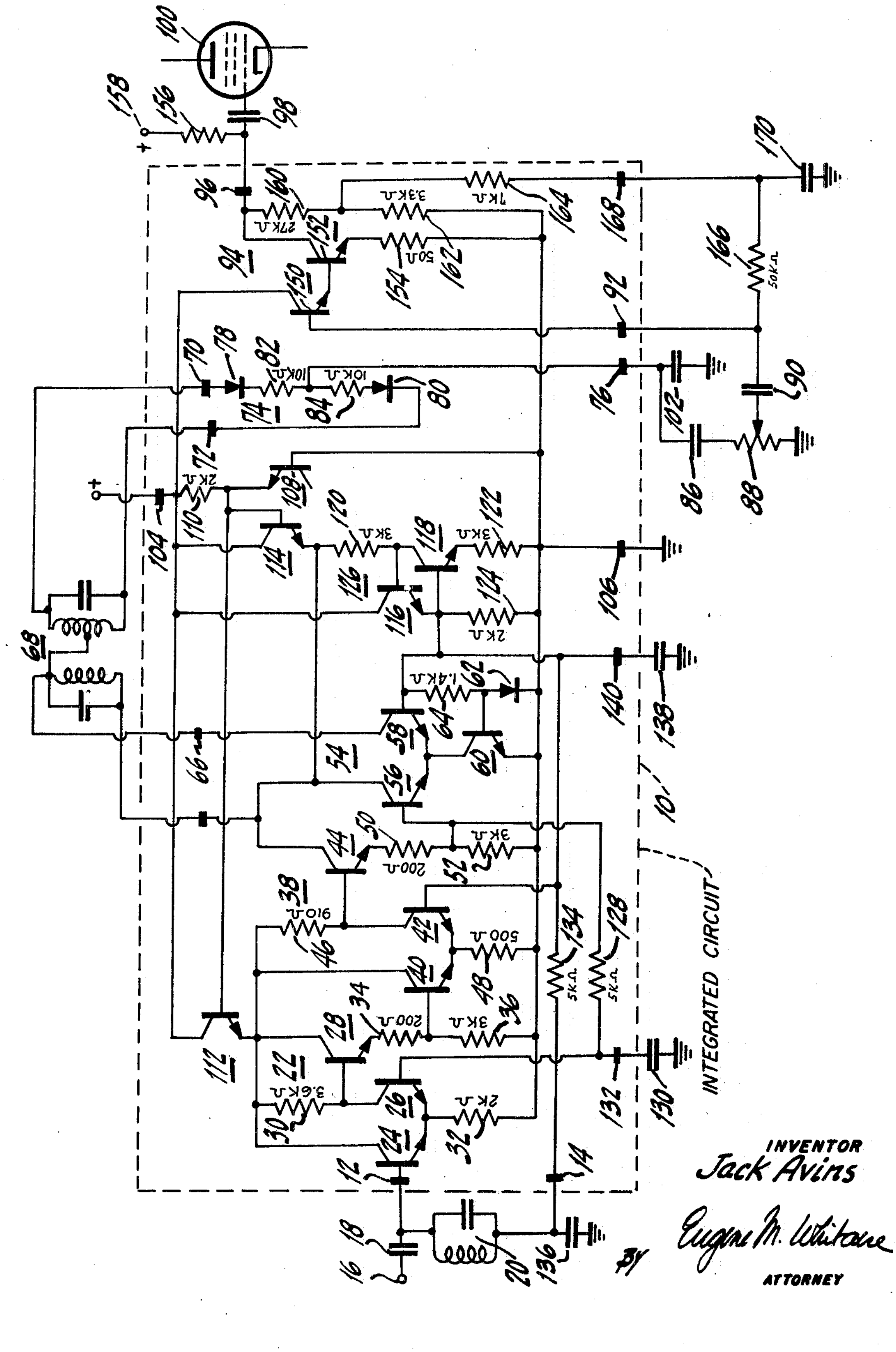
INVENTOR
Jack Avins
BY Eugene M. Whitacre
ATTORNEY United States Patent Office 3,512,098
Patented May 12, 1970

3,512,098
TRANSISTOR ELECTRICAL CIRCUIT WITH COLLECTOR VOLTAGE STABILIZATION

Jack Avins, Princeton, N.J., assignor to RCA Corporation, a corporation of Delaware Filed Aug. 28, 1967, Ser. No. 663,871
Int. Cl. H03f *1/34*
U.S. Cl. 330—25 4 Claims

ABSTRACT OF THE DISCLOSURE

An electrical circuit wherein a signal output swing can be obtained from a transistor of a magnitude comparable to, but without exceeding, the collector breakdown voltage thereof, and wherein the transistor operates from an unregulated source of supply voltage substantially in excess of that breakdown voltage through a series dropping resistor subject to tolerance variations in its absolute value.

This invention relates to electrical circuits and, more particularly, to an integrated circuit especially useful in electronic equipment of the type including solid state and vacuum tube amplifying devices operating in combination. As used herein, the term "integrated circuit" refers to a unitary or monolithic semiconductor device or chip which is the equivalent of a network of interconnected active and passive circuit elements.

In accordance with the invention, there is provided an electrical circuit including a transistor operating from a source of supply voltage substantially in excess of its collector-base breakdown voltage through a series dropping resistor. Means are additionally included to stabilize the operating point of the transistor at an optimum value such that a signal output swing of a magnitude comparable to, but without exceeding, the transistor breakdown voltage can be obtained, even in the presence of variations in the supply voltage and/or in the absolute value of the coupling resistor. Such a transistor circuit can then be employed to drive a vacuum tube stage which requires an input signal swing of corresponding magnitude to operate most effectively. As will become clear hereinafter, one embodiment of the invention includes a pair of resistors of predetermined ratio connected in a negative feedback path to stabilize the quiescent direct current (D-C) output potential at the collector electrode of the transistor at substantially one-half its collector breakdown voltage. This ensures that the breakdown voltage will not be exceeded by any variations in the supply voltage and/or in the value of the series dropping resistor tending to increase the quiescent D-C potential and output signal swing. It also ensures that minimum distortion will be introduced in the following stage by any variations tending to decrease the quiescent potential and output signal drive of the transistor.

The novel features which are considered characteristic of this invention are set forth with particularity in the appended claims. The invention itself, however, both to its organization and method of operation as well as additional objects and advantages thereof will best be understood from the following description when read in conjunction with the single figure of the drawing which represents a schematic circuit diagram of an angle modulated wave processing channel for television receivers which may be incorporated in an integrated circuit device.

The schematic circuit diagram of the drawing shows the use of multiple three transistor amplifier stages in the sound channel of a television receiver. The rectangle 10 schematically illustrates a monolithic semiconductor circuit chip. The chip has a plurality of contact areas about the periphery thereof through which connections to the circuit on the chip may be made. For example, the chip 10 has a pair of contact areas 12 and 14 which are coupled to a source of frequency modulated (FM) waves. As to physical dimensions, the chip 10 may be of the order of 50 mils x 50 mils, or smaller. The manner of implementing the various transistor, diode and resistor functional portions described below in a monolithic chip is known in the art.

FM signals from a suitable source, such as a video detector or video amplifier of the television receiver, are applied to a terminal 16 and coupled through a capacitor 18 to a resonant circuit 20 which is tuned to the 4.5 mHz. intercarrier beat between the video and sound carriers of the television signal. The resonant circuit 20 and the coupling capacitor 18 in the present example are external to the chip but are coupled thereto through the contact areas 12 and 14.

The contact area 12 is directly coupled to a first amplifier stage 22 including three transistors 24, 26 and 28. The first two transistors 24 and 26 are connected by resistors 30 and 32 to provide an emitter coupled amplifier and the third transistor 28 is connected by resistors 34 and 36 as an emitter follower. The amplifier stage 22 is shown as being of the type described in the pending application Ser. No. 650,088, filed June 29, 1967, and entitled "Signal Translating System." The output signal developed by the stage 22 appears at the junction of resistors 34 and 36.

The amplifier stage 22 is directly coupled to a similar amplifier stage 38 which also includes three transistors 40, 42 and 44. The first two transistors 40 and 42 are also connected by a pair of resistors 46 and 48 to form the emitter coupled amplifier construction while the third transistor 44 is also connected as an emitter follower, by resistors 50 and 52.

Output signals from the stage 38 are developed across the resistor 52 and applied to a limiter stage 54 including transistors 56, 58 and 60, a diode 62 and a resistor 64. The transistor 60 functions as a constant current source for the limiter stage 54, and is temperature compensated by the diode 62 in a known manner. The transistor 58 portion of the stage 54 is connected through a contact area 66 to drive the primary winding of a discriminator transformer 68. The secondary winding of the discriminator transformer 68 is connected through a pair of contact areas 70 and 72 to the remainder of the discriminator circuit 74. The discriminator circuit 74 is balanced to provide a direct output voltage at a contact area 76 which does not vary with signal level.

The discriminator circuit 74 is of the type described in the pending application entitled, "Signal Translating System," Ser. No. 531,652, filed Feb. 28, 1966. More particularly, the circuit 74 is of the form of a ratio detector but without the large non-integratable capacitor normally used to obtain peak rectification. The oppositely poled rectifier devices of the discriminator circuit 74 are shown by the reference numerals 78 and 80 while the distributed capacitance of the integrated load resistors 82 and 84 provide filtering of the signal frequency and its harmonics.

The demodulated signals developed by the discriminator 74 are coupled by means of the contact area 76, a first capacitor 86, a potentiometer 88, a second capacitor 90 and a contact area 92 to the input of an audio frequency amplifier stage 94 constructed in accordance with the present invention and to be described hereinafter. Output signals developed by the stage 94 are coupled by means of a contact area 96 and a third capacitor 98 to an audio frequency output stage including, for example, a vacuum tube 100 for driving a speaker (not shown). A de-emphasis capacitor 102 couples the contact area 76 to a point of reference potential, indicated as ground.

The positive terminal of a D-C supply source for the circuit (which may be subject to some variation) is connected to a contact area 104, while the grounded negative terminal is connected to another contact area 106. The supply voltage variation is regulated by the emitter-base breakdown voltage of a transistor 108, which is connected to the contact area 104 via a resistor 110 and whose collector electrode is left unconnected. Transistors 112 and 114, connected to the contact area 104 and to the transistor 108, serve as emitter followers to isolate the regulated voltage fed to the transistors 24, 26, 28, 40 and 42 from that fed to the transistors 44, 56 and 58.

A pair of transistors 116 and 118 and three resistors 120, 122 and 124 are also included in the circuit of the drawing, and comprise a bias potential supply 126 for the amplifier stages 22 and 38. This supply 126 is of the type disclosed in the pending application, Ser. No. 510,-307, filed Nov. 29, 1965, and entitled, "Electrical Circuit." In a manner analogous to that described therein, the supply 126 develops a voltage across the resistor 124 which is substantially one-half the value of the supply voltage at the end of resistor 120 remote from the collector electrode of transistor 118 and which is independent of temperature and supply voltage variations. Operating point stability of the amplifier stages 22 and 38 is maintained by use of direct current feedback through resistor 128 around those two stages, with a bypass capacitor 130 connected to the resistor 128 via contact area 132. The limiter stage 54 is then held automatically at the proper operating point because the feedback around the amplifier stages 22 and 38 holds the voltage at the base electrode of the transistor 56 at one-half the aforementioned supply voltage. The limiter stage 54 is thus balanced without being in the feedback loop. This is desirable because the tendency toward oscillation in the feedback loop is reduced by keeping the number of stages as low as possible. Proper bias voltage for the limiter stage 54 is made essentially independent of transistor gain through the use of a resistor 134, connected in the base electrode return of transistor 24 and equal in value to the resistor 128 connected in the base electrode return of transistor 26. Bypass capacitors 136 and 138 are connected to the resistor 134 by means of the contact areas 14 and 140, respectively.

Considering, now, the audio frequency amplifier 94 in more detail, it includes a first transistor 150 connected in a circuit configuration driving a second transistor 152 connected as a common emitter stage. More particularly: the base electrode of the transistor 150 is connected to the audio frequency input contact area 92, its collector electrode is connected to the positive potential contact area 104, and its emitter electrode is connected to the base electrode of the transistor 152. The emitter electrode of the transistor 152 is correspondingly connected by means of a resistor 154 to the ground contact area 106, while the collector electrode of that transistor is coupled by means of the contact area 96 and a voltage dropping load resistor 156 (located external to the integrated chip 10) to a source of operating voltage, represented in the drawing by the positive potential terminal 158. A first pair of serially connected resistors 160 and 162 couple the collector electrode of transistor 152 to the ground contact 106, while a second such pair of resistors 164 and 166 couple the junction of the resistors 160 and 162 to the base electrode of transistor 150, completing a feedback path via the contact areas 92 and 168. Of the four last named resistors, all but resistor 166 are included on the integrated chip, as shown. A capacitor 170 is further included to connect the junction of resistors 164 and 166 to ground at the contact area 168 so as to provide full degeneration of the D-C feedback component without affecting A-C signal gain.

Since an audio frequency output tube oftentimes costs less than a comparable output transistor, the sound channel construction of the drawing illustrates such a tube being driven by the transistor 152. The signal swing obtainable from the transistor 152 is generally limited to a magnitude comparable to its collector breakdown voltage. Furthermore, a vacuum tube capable of developing maximum power output with that signal swing will be the one that operates most effectively. In one construction of the sound channel, a 6AQ5 type was used as the audio frequency output tube 100, to match the 30 volt peak-to-peak signal swing obtainable from the monolithic silicon integrated circuit structure of the transistor 152. A +140 volt supply available in the receiver was used as the operating voltage for the transistor 152 and an 82K ohm resistor was employed as the resistor 156. With such an arrangement, and with a low value resistor 154 in the emitter circuit of the transistor 152 (e.g. 50 ohms), a quiescent D-C potential of approximately +15 volts was established, and a 30 volt signal swing obtained, at the collector electrode of that transistor. It will be understood that the load resistor 156 is connected external to the integrated chip 10 in order to prevent its power dissipation from exceeding that of the integrated chip and because the chip is generally unable to directly handle an input of 140 volts D-C without breaking down.

Problems may be created, however, if either or both of the supply voltage and load resistance suffer variations in their respective absolute values. Variations in the 140 volt operating supply and/or in the nominal value of the resistor 156 which are in a direction to increase the D-C potential and signal swing at the transistor 152 collector electrode, for example, may well cause the transistor breakdown voltage to be exceeded. Similar variations, but in the opposite direction on the other hand, may well reduce the effectiveness of the audio output tube 100 since the input drive signal will be diminished below the optimum 30 volt peak-to-peak value required to develop its maximum power output.

Such variations in the D-C potential, are prevented however, according to the invention, through the use of a negative feedback circuit including the resistors 160 and 162. These resistors form a voltage divider across the transistor 152, whose value remains substantially fixed because the ratio between those resistors in an integrated circuit structure is relatively stable, although their absolute values may vary because of the manufacturing process tolerances. The precise ratio for these resistors 160 and 162 is selected such that the quiescent D–C voltage at their junction less the small D–C drops across the resistors 164 and 166 substantially equals the desired quiescent voltage drop from the base electrode of transistor 150 to ground; i.e., the sum of the base-to-emitter voltage drops of the transistors 150 and 152, and the drop across the emitter resistor 154. With the values shown in the drawing, the voltage drop across resistor 154 is approximately 0.08 volt, the drop across the base-emitter junction of transistor 152 is approximately 0.7 volt (the voltage drop when a transistor fabricated of monolithic silicon operates as a Class A amplifier), and the drop across the base-emitter junction of transistor 150 is approximately 0.5 volt. With a +14 volt D-C level at the collector electrode of transistor 152, therefore, a resistance ratio of approximately 9:1 between resistors 160 and 162 provides the necessary 1.28 volts feedback voltage, the precise ratio being calculable from the values shown in the drawing. These parameters are such that any change in the quiescent D-C operating point at the collector electrode of transistor 152 causes an offsetting change at the base electrode of the transistor 150 of such a magnitude as to stabilize the D-C voltage at the collector electrode. (In this respect it will be noted that changes in the quiescent current flowing through the small resistor 154 due to variations in the D-C operating point produce only minor effects, so that in essence, a varying D-C potential at the collector electrode of transistor 152 is being compared to a substantially fixed D-C potential at the base electrode of transistor 150.) Any distortion which might otherwise result due to the transistor's collector breakdown voltage being execeeded or due to its collector output swing being diminished is thereby minimized.

It will thus be appreciated that by stabilizing the quiescent D-C potential at the collector electrode of the output transistor 152 in the foregoing manner, an unregulated supply source (e.g., ±15% variation) can be used to provide the operating voltage for the transistor 152, and through a 10% voltage dropping load resistor, for example. An output signal swing extending up to, and without exceeding, the breakdown voltage of the transistor 152 can then be obtained, even though the absolute component values in the circuit may vary over a wide range. As was previously mentioned, the 6AQ5 type audio output tube operates most effectively with this signal swing.

It will also be appreciated that the transistor 150 can be omitted from the circuit of the drawing and the operation maintained by changing the ratio of the resistors 160 and 162 so as to stabilize the D-C potential at the base electrode of transistor 152 at a value substantially equal to the drop across its base-emitter junction and across its emitter load resistor 154. The inclusion of the transistor 150, as shown in the drawing, is to be preferred, however, since it permits the use of a large resistor 166 to provide a high point impedance of the stage 94, while restricting the voltage drop across that resistor to be a few tenths of a volt. Were it not for the current gain provided by the transistor 150, a much smaller resistor would be required in order to prevent its tolerance variations from changing the quiescent voltage at the base electrode of transistor 152 by an amount sufficient to cause the collector breakdown voltage to be exceeded.

What is claimed is:

1. An electrical circuit comprising:

an amplifier stage including a first transistor having at least collector and base electrodes and exhibiting a predetermined collector breakdown voltage, an operating potential supply, and a direct current impedance coupling said operating supply to said transistor, said impedance and said supply coacting to produce a quiescent direct potential at said collector electrode which, due to undesirable random variations thereof, tends to exceed said breakdown voltage;

second means including a voltage divider having a pair of resistors serially connected to said collector electrode, with the junction between said resistors being coupled to said base electrode, said second means being responsive to said random variations for coupling a predetermined portion thereof to said base electrode to stabilize said quiescent potential at a level substantially equal to one-half said breakdown voltage such that in response to applied input signals, said transistor develops output signals, the maximum amplitude of which is comparable to, and without exceeding, said breakdown voltage;

a second transistor having input, output and common electrodes arranged to receive input signals at said input electrode and to develop output signals at said output electrode; means for coupling said output electrode to the base electrode of said first transistor; and a second operating potential supply having a value less than said breakdown voltage direct current connected between said output and common electrodes of said second transistor;

with at least said voltage divider and said first and second transistors being incorporated in a single integrated circuit.

2. A signal translating stage comprising:

a first transistor having collector, base and emitter electrodes and exhibiting a predetermined breakdown voltage at said collector electrode;

a signal input terminal coupled to said base electrode;

a signal output electrode coupled to said collector electrode;

a first source of unregulated operating potential having a value substantially in excess of said breakdown voltage;

a first resistor coupling said source of potential to said collector electrode;

a second resistor coupling said emitter electrode to a point of reference potential;

third and fourth resistors serially connected to said collector electrode for developing a predetermined direct voltage at their common junction;

means coupled to said junction for coupling said direct voltage to said base electrode, said third and fourth resistors being incorporated in a single integrated circuit with the ratio between said third and fourth resistors being selected to stabilize the quiescent direct potential at said collector electrode at substantially one-half said breakdown voltage;

said means coupled to said junction comprising a second transistor having collector, base and emitter electrodes;

a second source of operating potential having a value less than said breakdown voltage;

a direct connection from said second source to the collector electrode of said second transistor;

means for coupling the emitter electrode of said second transistor to said signal input terminal; and means for coupling input signals to the base electrode of said second transistor.

3. A signal translating stage comprising:

a first transistor having collector, base and emitter electrodes and exhibiting a predetermined breakdown voltage between the first two of said three electrodes;

a second transistor having collector, base and emitter electrodes;

a signal input terminal coupled to the base electrode of said second transistor;

a signal output terminal coupled to the collector electrode of said first transistor;

a first source of operating potential having a value less than said breakdown voltage;

a second source of operating potential having a value in excess of said breakdown voltage;

a direct connection from said first source to the collector electrode of said second transistor;

a direct connection from the emitter electrode of said second transistor to the base electrode of said first transistor;

a first resistor coupling said second source to the collector electrode of said first transistor;

a second resistor coupling the emitter electrode of said first transistor to a point of reference potential;

third and fourth resistors serially connected between the collector electrode of said first transistor and said point of reference potential for developing a predetermined direct voltage defined hereinafter at their common junction;

fifth and sixth resistors serially connected between the base electrode of said second transistor and said common junction;

and a capacitor coupled between the common junction of said fifth and sixth resistors and said point of reference potential;

with at least said third and fourth resistors being incorporated in a single integrated circuit and with the ratio therebetween being such that the direct voltage developed at their common junction when fed back to the base electrode of said second transistor via said fifth and sixth resistors substantially equals the sum of the voltage drops between the base and emitter electrodes of said first and second transistors and across said second resistor.

4. A signal translating stage as defined in claim 3 wherein said first source supplies a regulated operating potential while said second source supplies an unregulated potential and wherein said first and second transistors and said second and fifth resistors are additionally included within said integrated circuit.

References Cited

UNITED STATES PATENTS

| | | | |
|---|---|---|---|
| 2,762,873 | 9/1956 | Goodrich. | |
| 2,808,471 | 10/1957 | Poucel et al. | 330—28 X |
| 2,977,546 | 3/1961 | Molnar | 330—25 |
| 3,121,201 | 2/1964 | Bernstein-Bervery et al. | 330—3 |

ROY LAKE, Primary Examiner

J. B. MULLINS, Assistant Examiner

U.S. Cl. X.R.

330—19, 20, 38

UNITED STATES PATENT OFFICE

CERTIFICATE OF CORRECTION

Patent No. 3,512,098 Dated May 12, 1970

Inventor(s) Jack Avins

It is certified that error appears in the above-identified patent and that said Letters Patent are hereby corrected as shown below:

Column 4, line 61, for "+14", substitute--+15--. Column 5, line 27, for "point", substitute--input--.

SIGNED AND SEALED SEP 15 1970

(SEAL)
Attest:

Edward M. Fletcher, Jr.
Attesting Officer

WILLIAM E. SCHUYLER, JR.
Commissioner of Patents